United States Patent
Avanic et al.

[19]

[11] Patent Number: 5,512,862
[45] Date of Patent: Apr. 30, 1996

[54] OSCILLATOR WITH IMPROVED SIDEBAND NOISE

[75] Inventors: Branko Avanic, Miami; Peter J. Yeh, Coral Springs; Leng H. Ooi, Plantation, all of Fla.

[73] Assignee: Motorola, Inc., Schaumburg, Ill.

[21] Appl. No.: 376,615

[22] Filed: Jan. 23, 1995

[51] Int. Cl.$^6$ ..................... H03B 5/18
[52] U.S. Cl. ................. 331/117 D; 331/99; 331/177 V; 455/318
[58] Field of Search ....................... 331/36 C, 96, 331/99–102, 107 SL, 117 R, 117 FE, 117 O, 177 V; 455/318

[56] References Cited

U.S. PATENT DOCUMENTS

| | | | |
|---|---|---|---|
| 4,140,982 | 2/1979 | Alexander | 331/99 X |
| 4,713,632 | 12/1987 | Nishikawa et al. | 331/117 D |
| 4,760,352 | 7/1988 | Ash | 331/107 A |
| 4,891,610 | 1/1990 | Veith | 331/96 |
| 5,185,583 | 2/1993 | Ooi et al. | 331/117 D X |

*Primary Examiner*—David Mis
*Attorney, Agent, or Firm*—M. Mansour Ghomeshi

[57] ABSTRACT

An oscillator (200) with improved sideband noise is disclosed. This improvement is accomplished without affecting the Q or the output power of the oscillator (200). The improvement is realized by increasing the rate of change of reactance over frequency. The increase in the rate of change is realized by placing two transmission lines (208, 210) in close proximity of each other. This increase assures oscillation while minimizing the sideband noise, and providing maximum bandwidth.

8 Claims, 2 Drawing Sheets

OSCILLATOR WITH IMPROVED SIDEBAND NOISE

TECHNICAL FIELD

This invention is generally related to oscillators and more particularly to Hartley oscillators.

BACKGROUND OF THE INVENTION

Hartley oscillators are commonly used in the field as a means of generating stable oscillator signals. In general, a Hartley oscillator includes a feedback circuit formed via a tapped inductor. In the prior art, this inductor is implemented either with discrete components or with micro-strip transmission lines. The latter is realized by printing a transmission line on a substrate providing for an easy realization of the tapped line. In oscillator with tapped micro-strip transmission line the tapped inductor normally serves as the main resonator. In such applications, the Q of the tank circuit is determined by the combination of the varactor network, the tuning capacitor and the tapped inductor.

One of the major advantages of a Hartley configuration is the minimization of capacitance in the tank circuit. This is accomplished by including the tapped inductor in the feedback network. The bandwidth of the oscillator for a constant tuning range may be increased simply by lowering the capacitance of the tank circuit. A problem that is encountered is the sideband noise that is increased as the bandwidth is increased. Attempts to lower this effect include increasing the Q and power both of which are generally costly to attain.

It is therefore desired to have an oscillator with maximum bandwidth and minimum sideband noise without significant effect on the oscillator Q.

DETAILED DESCRIPTION OF THE PREFERRED EMBODIMENT

Figure 1:
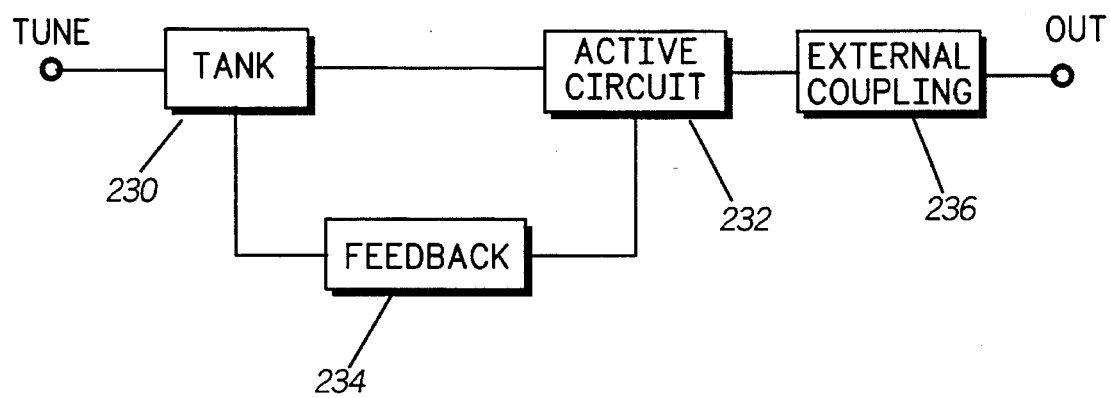
FIG. 1 is block diagram of an oscillator in accordance with the present invention.
Figure 2:
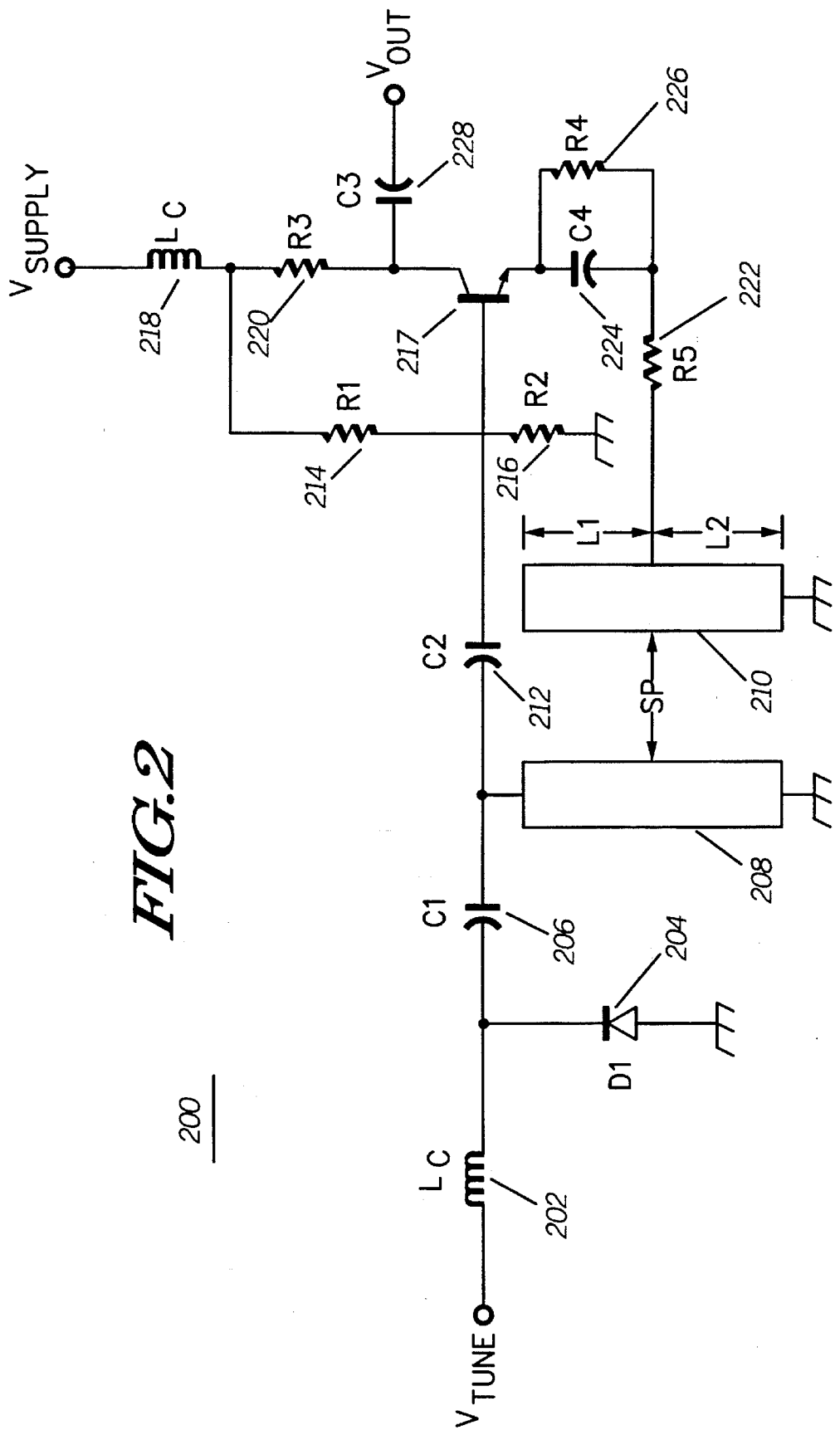
FIG. 2 is a schematic diagram of an oscillator in accordance with the present invention.

Referring to FIGS. 1 and 2, a block diagram and a circuit diagram, respectively of a micro-strip coupled line Hartley oscillator 200 in accordance with the invention is shown. This oscillator is preferably a Voltage Controlled Oscillator (VCO). The oscillator 200 comprises a tank circuit 230, an active stage 232, a feedback path 234, and an external coupling network 236.

The tank network 230 includes a first micro-strip transmission line 208 electro-magnetically coupled to a second micro-strip transmission line 210. The second micro-strip transmission line 210 is electrically coupled to one of the outputs of the active network through resistor 222. Similarly, the first micro-strip transmission line 208 is electrically coupled to the input of the active network through capacitor 212 and to the varactor 204 through capacitor 206. The resonant frequency of the oscillator 200 is determined by the length (i.e. L1+L2) of the micro-strip transmission lines 208 and 210 in combination with the total equivalent capacitance associated with varactor 204, capacitor 206, internal capacitance of transistor 217 and capacitor 212. The series combination of capacitor 206 and varactor 204 constitute the capacitive component of the tank circuit 230. The tuning bandwidth of the VCO 200 is controlled by a DC voltage connected to $V_{tune}$ which modulates the varactor capacitance and thus the center frequency of the oscillator 200. It is noted that a Voltage Variable Capacitor (VVC) may be used in place of the varactor 204.

The micro-strip transmission line 210 is preferably a tapped transmission line which assists in controlling the impedance presented to the active stage. Similarly and in order to control the impedance presented to the tank circuit, the micro-strip transmission line 208 may be a tapped transmission line.

It is well known (Leesons formula (IEEE Proceedings, February 66, pgs 329–330) that the sideband noise of an oscillator is inversely proportional to the square of the Quality factor of the tank circuit. Furthermore, it is well known that the Quality factor of a resonant structure can be written as:

$$Q = \frac{Wo}{2R} \frac{dX}{dw}$$

where R represents the losses, wo is the center frequency and dX/dw represents the rate of change of reactance vs. frequency. It is commonly believed that the sideband noise of the oscillator is primarily affected by the losses of the tank circuit. The present invention, on the other hand, suggests that the rate of change of reactance vs. frequency has a more significant impact on the performance of the sideband noise. It can be shown that two circuits with the same Quality Factor (Q) but with different rates of change of reactance vs. frequency will exhibit different sideband noise performance. The circuit with the higher rate of change of reactance vs. frequency will exhibit a better sideband noise performance. Benefiting from this phenomenon and as shown in FIG. 2, the inductive section of the tank circuit 230 is formed by two micro-strip transmission lines 208 and 210, which effectively doubles the change of reactance vs. frequency of the tank circuit 230. Furthermore, by using the micro-strip transmission lines 208 and 210 in the feedback path, a new Hartley topology is created. The two micro-strip transmission lines are used as part of the feedback loop to further maximize the tuning bandwidth of the oscillator 200 by minimizing the total capacitance in the oscillator. With this scheme, oscillation is assured with improved sideband noise without affecting the Q or the output power of the oscillator 200.

The active network 232 is composed of resistors 214, 216, 220, 226, the inductor 218 (acting as a choke), bypass capacitor 224, and transistor 217, which can be of bipolar construction as shown or of any Field Effect Transistor family. The resistors 214, 216, 220, and 226 are used to set the Quiescent operating point of the transistor 217. The transistor 217 is used as the gain element of the VCO 200.

The feedback network 234 provides a feedback path between the tank circuit 230 and the active circuit 232. Unlike Harltey and Colpits oscillators, the oscillator 200 provides two additional degrees of freedom in the design of oscillators. Not only is it possible to adjust the feedback by adjusting the tap position where resistor 222 is connected to the second micro-strip transmission line 210 (i.e. L1,L2) but also by changing the spacing between the first micro-strip transmission line 208 and the second micro-strip transmission line 210 a more effective control on the feedback of the oscillator 200 is obtained. Resistor 222 is used as a linearizing element for transistor 217 and is also part of the feedback path.

Finally the coupling network 236 is composed by a capacitor 228 which couples energy out of the active network 232 to an external load. In FIG. 2 the capacitor 228 is electrically connected to the collector of transistor 217. A similar circuit could be built where the capacitor 228 is electrically connected to the emitter of the transistor 217.

Figure 3:
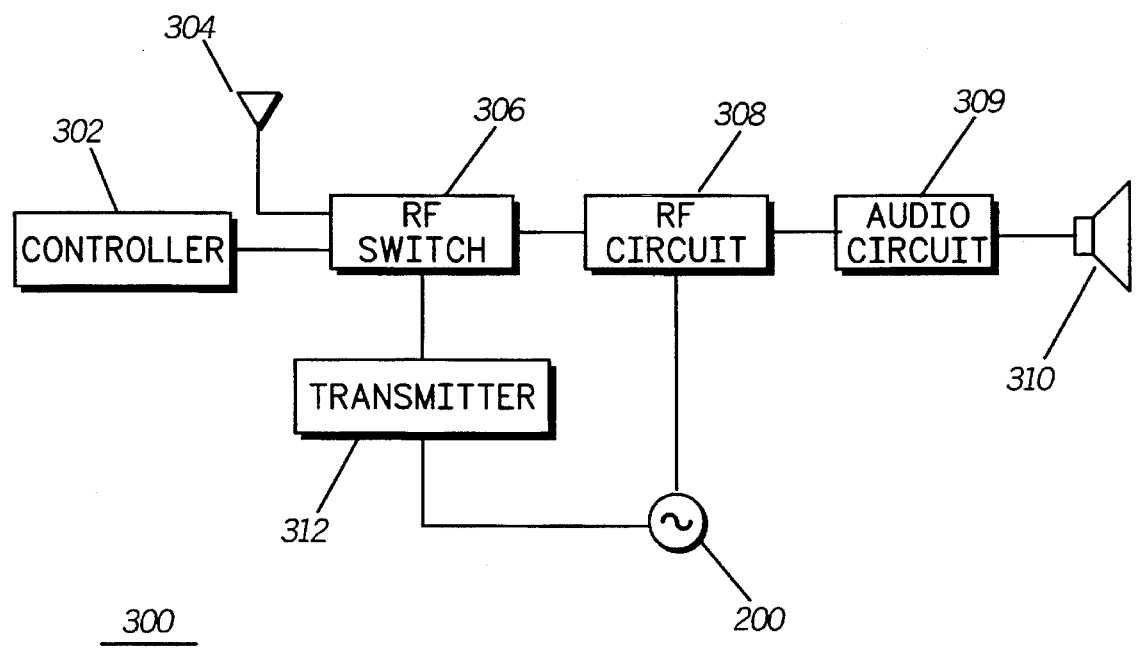
FIG. 3 is a block diagram of a communication device in accordance with the present invention.

Referring to FIG. 3 a block diagram of a communication device 300 (such as a FM radio transceiver) is shown in accordance with the present invention. A radio frequency signal received at an antenna 304 is coupled to RF circuits 308 through RF switch 306. This block contains such circuits as filters, mixers, and discriminators as is known in the art. The oscillator 200 provides block 308 with a local oscillator signal. The audio segments of the received signal after being recovered by audio circuit 309 are coupled to a speaker 310. Optionally, a transmitter 312 is used to transmit radio frequency signals. The transmitter 312 is coupled to the antenna 304 through an antenna switch 306 which couples the antenna 304 to the transmitter 312 or the RF circuits 308 depending on the operating mode. An oscillator signal from the VCO 200 is coupled to the transmitter 312. A controller 302 is used to control the operation of the communication device 300. In particular, the antenna switch 306 switches from receive to transmit mode under to command of the controller 302.

In summary, an oscillator with improved sideband noise is disclosed. This improvement is accomplished without affecting the Q or the output power of the oscillator. The improvement is realized by increasing the rate of change of reactance over frequency. The increase in the rate of change is realized by placing two transmission lines in close proximity of each other. This increase assures oscillation while minimizing the sideband noise, and providing maximum bandwidth.

What is claimed is:

1. An oscillator having a center frequency, and a sideband noise associated therewith, comprising:

an active stage having an input and an output;

a tank circuit for setting the center frequency, the tank circuit comprising:
      a capacitive component;
      a first micro-strip transmission line electrically coupled to the capacitive component and the input of the active stage, the first micro-strip transmission line includes a tapped transmission line in order to control the impedance presented to the tank circuit; and
      a second micro-strip transmission line situated in close proximity of the first micro-strip transmission line in order to provide electromagnetic coupling therebetween and further electrically coupled to the output of the active stage to establish a feedback mechanism between the input and the output of the active stage to insure oscillation stability, the second micro-strip transmission line having a tap section which when combined with the electromagnetic coupling increases the rate of change of reactance over frequency variations of the tank circuit hence decreasing the sideband noise without affecting the Q or the output power of the oscillator.

2. An oscillator having a center frequency and a sideband noise associated therewith, comprising:

an active stage;

tank circuit coupled to the active stage, the tank circuit comprising:
      a capacitive component;
      a first micro-strip transmission line coupled to the capacitive components;
      a second micro-strip transmission line electromagnetically coupled to the first micro-strip transmission line the second micro-strip transmission line includes a tapped transmission line in order to control the impedance presented to the active stage; and a feedback path between the tank circuit and the active stage comprising the first and second micro-strip transmission lines for assuring oscillation at the center frequency with minimum sideband noise without affecting the Q or the output power of the oscillator.

3. An oscillator having a Hartley configuration, a center frequency, and a sideband noise associated therewith, comprising:

an active stage having an input and an output;

a tank circuit for setting the center frequency, the tank circuit comprising:
      a capacitive component;
      a first micro-strip transmission line electrically coupled to the capacitive component and the input of the active stage; and
      a second micro-strip transmission line situated in close proximity of the first micro-strip transmission line in order to provide electromagnetic coupling therebetween and further electrically coupled to the output of the active stage to establish a feedback mechanism between the input and the output of the active stage to insure oscillation stability, the second micro-strip transmission line having a tap section which when combined with the electromagnetic coupling increases the rate of change of reactance over frequency variations of the tank circuit hence decreasing the sideband noise without affecting the Q or the output power of the oscillator.

4. The oscillator of claim 3, wherein the capacitive component includes a variable capacitance component.

5. The oscillator of claim 4, wherein the variable capacitance component includes a Voltage Variable Capacitor (VVC).

6. The oscillator of claim 4, wherein the variable capacitance component includes a varactor.

7. The oscillator of claim 3, wherein the capacitive component includes a fixed capacitance component.

8. A communication device, comprising:

a receiver for receiving a radio frequency signal, the receiver including;
      an oscillator having a center frequency, and a sideband noise associated therewith, comprising:
         an active stage having an input and an output;
         a tank circuit for setting the center frequency, the tank circuit comprising:
            a capacitive component;
            a first micro-strip transmission line electrically coupled to the capacitive component and the input of the active stage; and
         a second micro-strip transmission line situated in close proximity of the first micro-strip transmission line in order to provide electromagnetic coupling therebetween and further electrically coupled to the output of the active stage to establish a feedback mechanism between the input and the output of the active stage to insure oscillation stability, the second micro-strip transmission line having a tap section which when combined with the electromagnetic coupling increases the rate of change of reactance over frequency variations of the tank circuit hence decreasing the sideband noise without affecting the Q or the output power of the oscillator.

* * * * *